(12) United States Patent
Kamoshida et al.

(10) Patent No.: US 11,508,552 B2
(45) Date of Patent: Nov. 22, 2022

(54) ION MILLING DEVICE (71) Applicant: Hitachi High-Tech Corporation, Tokyo (JP)

(72) Inventors: Hitoshi Kamoshida, Tokyo (JP); Hisayuki Takasu, Tokyo (JP); Atsushi Kamino, Tokyo (JP)

(73) Assignee: Hitachi High-Tech Corporation, Tokyo (JP)

(*) Notice: Subject to any disclaimer, the term of this patent is extended or adjusted under 35 U.S.C. 154(b) by 0 days.

(21) Appl. No.: 17/270,893

(22) PCT Filed: Aug. 31, 2018

(86) PCT No.: PCT/JP2018/032337
§ 371 (c)(1),
(2) Date: Feb. 24, 2021

(87) PCT Pub. No.: WO2020/044531
PCT Pub. Date: Mar. 5, 2020

(65) Prior Publication Data
US 2021/0183615 A1 Jun. 17, 2021

(51) Int. Cl.
*H01J 37/304* (2006.01)
*H01J 37/08* (2006.01)

(52) U.S. Cl.
CPC ............ *H01J 37/304* (2013.01); *H01J 37/08* (2013.01); *H01J 2237/026* (2013.01);
(Continued)

(58) Field of Classification Search
CPC .... H01J 37/304; H01J 37/08; H01J 2237/026; H01J 2237/24535; H01J 2237/24542; H01J 2237/24578
See application file for complete search history.

(56) References Cited

U.S. PATENT DOCUMENTS

2006/0097195 A1* 5/2006 Angel ................. H01J 37/3171
250/397
2007/0184596 A1 8/2007 Ando
(Continued)

FOREIGN PATENT DOCUMENTS

JP 2002-216653 A 8/2002
JP 2006-73359 A 3/2006
(Continued)

OTHER PUBLICATIONS

International Search Report (PCT/ISA/210) issued in PCT Application No. PCT/JP2018/032337 dated Nov. 20, 2018 with English translation (four (4) pages).
(Continued)

*Primary Examiner* — David E Smith
(74) *Attorney, Agent, or Firm* — Crowell & Moring LLP (57) ABSTRACT

Provided is an ion milling device capable of improving the reproducibility of an ion distribution. An ion milling device includes: an ion source (1); a sample stage (2) on which a sample (4) to be processed by being irradiated with an unfocused ion beam from the ion source (1) is placed; and a drive unit (8) configured to be arranged between the ion source (1) and the sample stage (2), and to move a linear ion beam measuring member (7) extending in a first direction to a second direction orthogonal to the first direction, in which the drive unit (8) moves the ion beam measuring member (7) within an emission range of the ion beam in a state where the ion beam is outputted from the ion source (1) under a first emission condition, and an ion beam current flowing through the ion beam measuring member (7) is measured by irradiating the ion beam measuring member (7) with the ion beam.

11 Claims, 7 Drawing Sheets

(52) U.S. Cl.
CPC ............... *H01J 2237/24535* (2013.01); *H01J 2237/24542* (2013.01); *H01J 2237/24578* (2013.01)

(56) References Cited

U.S. PATENT DOCUMENTS

| | | | |
|---|---|---|---|
| 2008/0237491 A1* | 10/2008 | Caliendo | H01L 22/20 257/E21.525 |
| 2008/0251737 A1 | 10/2008 | Tsukihara et al. | |
| 2010/0171048 A1 | 7/2010 | Nakamoto et al. | |
| 2012/0211166 A1* | 8/2012 | Yevtukhov | H01J 37/3053 250/424 |
| 2016/0312357 A1* | 10/2016 | Gammel | H01J 37/3171 |
| 2017/0221677 A1* | 8/2017 | Asai | H01J 27/04 |
| 2018/0068828 A1* | 3/2018 | Hailing | H01J 37/147 |

FOREIGN PATENT DOCUMENTS

| | | |
|---|---|---|
| JP | 2007-273368 A | 10/2007 |
| JP | 2008-47459 A | 2/2008 |
| JP | 2008-262748 A | 10/2008 |
| JP | 2016-31869 A | 3/2016 |
| JP | 2017-33920 A | 2/2017 |

OTHER PUBLICATIONS

Japanese-language Written Opinion (PCT/ISA/237) issued in PCT Application No. PCT/JP2018/032337 dated Nov. 20, 2018 (six (6) pages).

Japanese-language Written Opinion of the International Preliminary Examining Authority (PCT/IPEA/408) issued in PCT Application No. PCT/JP2018/032337dated Sep. 8, 2020 (six (6) pages).

* cited by examiner

ION MILLING DEVICE

TECHNICAL FIELD

The present invention relates to an ion milling device.

BACKGROUND ART

JP-A-2002-216653 (PTL 1) discloses an ion milling device that extracts an ion by generating plasma in an ion source, and that performs processing on a substrate by emitting the extracted ion. It is disclosed that since the ion milling device performs processing on, for example, a 4-inch (Φ100) substrate, and obtains an ion beam of a large diameter having a uniform or desired distribution, the ion milling device controls a distribution of the extracted ion beam by electrically controlling a plasma distribution in the ion source. As an example of a control method, it is disclosed that a distribution state of the ion beam is measured by using a Faraday cup and a voltage applied to a plasma control electrode is adjusted based upon a measurement result.

CITATION LIST

Patent Literature

PTL 1: JP-A-2002-216653

SUMMARY OF INVENTION

Technical Problem

An ion milling device is a device for polishing a surface of a sample or a cross section thereof by irradiating the sample (for example, metal, semiconductor, glass, and ceramic) with an unfocused ion beam and flicking an atom on the surface of the sample without stress by a sputtering phenomenon. The ion milling device is used as a pretreatment device for observing the surface of the sample or the cross section thereof by a scanning electron microscope (SEM) and a transmission electron microscope (TEM). An effective penning method for miniaturizing a structure is often adopted for an ion generation source of the above-described pretreatment device.

Since an ion beam from a penning type ion source is emitted to the sample in a state where the ion beam is not focused, an ion distribution in the vicinity of an ion beam emission point of the sample has a characteristic that ion density is the highest at a center portion of the ion distribution and the ion density becomes lower toward the outside from the center portion thereof. On the other hand, particularly, in the case of surface observation with an electron microscope, it is necessary to polish the sample surface smoothly in order to accurately observe the structure and composition. Therefore, the ion beam is emitted to the sample at a low incident angle while rotating the sample. Accordingly, it is possible to obtain a wide and smooth processed surface in a peripheral area including a portion to be observed. Since the ion density is directly linked to a processing speed (milling rate) of the sample, the characteristic of the ion distribution significantly affects a processed shape of the processed surface of the sample.

It is known that the ion generated and emitted from a structure of the penning type ion source wears an internal component. As a result of processing the sample, a fine particle that is generated from the processed surface and that floats particularly adheres to an ion emission port of the ion generation source, and causes dirt. Due to such factors, when the ion milling device is continuously used, a characteristic of the ion beam may change, and reproducibility of the processed shape of the processed surface of the sample may deteriorate. When the observation with the electron microscope is performed for the purpose of mass production process control, it is required to perform the same processing on a large number of samples, such that the deterioration in the reproducibility of the processed shape of the ion milling device may lead to deterioration in defect detection accuracy.

Considering the above-described problems, the present invention provides a method for adjusting an ion beam, which is suitable for an ion milling device that performs a pretreatment process of observing a surface of a sample or a cross section thereof, and an ion milling device capable of adjusting an emission condition of the ion beam.

Solution to Problem

An ion milling device according to an embodiment of the present invention includes: an ion source; a sample stage on which a sample to be processed by being irradiated with an unfocused ion beam from the ion source is placed; a drive unit configured to be arranged between the ion source and the sample stage, and to move a linear ion beam measuring member extending in a first direction to a second direction orthogonal to the first direction; and a control unit, in which the control unit moves the ion beam measuring member within an emission range of the ion beam by the drive unit in a state where the ion beam is outputted from the ion source under a first emission condition, and measures an ion beam current flowing through the ion beam measuring member by irradiating the ion beam measuring member with the ion beam.

An ion milling device according to another embodiment of the present invention includes: a sample chamber; an ion source position adjusting mechanism installed in the sample chamber; an ion source attached to the sample chamber via the ion source position adjusting mechanism; a sample stage on which a sample to be processed by being irradiated with an unfocused ion beam from the ion source is placed; and a control unit, in which the control unit obtains an adjustment value of a first emission condition based upon an ion distribution when the sample is irradiated with the ion beam from the ion source under the first emission condition, the ion source is a penning type ion source, and the control unit includes at least one of a discharge voltage of the ion source, a gas flow rate of the ion source, and a distance between the ion source and the sample as a parameter for obtaining the adjustment value of the first emission condition.

Advantageous Effects of Invention

It is possible to improve the reproducibility of an ion distribution of an ion milling device.

Other subjects and novel features will become apparent from the description and accompanying drawings in the specification.

DESCRIPTION OF EMBODIMENTS

Hereinafter, embodiments of the present invention will be described with reference to the drawings.

Figure 1:
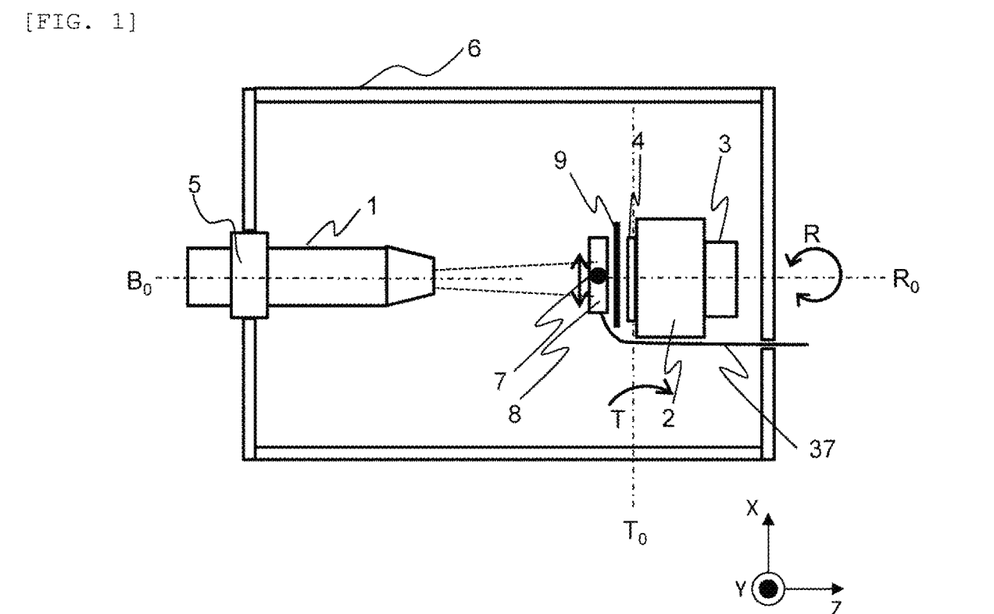
FIG. 1 is a configuration example (schematic diagram) of an ion milling device.

FIG. 1 is a diagram (schematic diagram) illustrating a main part of an ion milling device according to an embodiment of the present invention from above (a vertical direction is defined as a Y direction). A sample chamber 6 capable of maintaining a vacuum state includes: an ion source 1; a sample stage 2 where a sample 4 which is a target to be processed is installed; a sample stage rotation drive source 3 that rotates the sample stage 2 in an R direction around a rotation center $R_0$; an ion beam measuring member 7 which is arranged close to a sample placing surface of the sample stage 2; a drive unit 8 that drives the ion beam measuring member 7 back and forth in an X direction; and a sample protecting shutter 9 installed between the ion beam measuring member 7 and the sample placing surface of the sample stage 2.

An ion beam from the ion source 1 is emitted to the sample 4 placed on the sample placing surface of the sample stage 2 in a state of radially spreading around an ion beam center $B_0$. When the sample 4 is processed, it is necessary to adjust the rotation center $R_0$ and the ion beam center $B_0$ to coincide with each other. In order to easily perform the above-described adjustment, the ion source 1 is mounted on the sample chamber 6 via an ion source position adjusting mechanism 5 that adjusts a position of the ion source 1 in the X direction, the Y direction, and a Z direction. As a result, a position of the ion beam center $B_0$ of the ion source 1, specifically, a position on an XY plane (plane including the X direction and the Y direction) and an operating distance (position in the Z direction, specifically, a distance from an ion beam emission position of the ion source 1 to the sample stage 2) can be adjusted.

The sample stage 2 has the rotation center $R_0$ extending in the Z direction and a tilt axis $T_0$ extending in the X direction and intersecting with the rotation center $R_0$ on the sample placing surface of the sample stage 2, and the sample stage 2 can be tilted around the tilt axis $T_0$. The drawing illustrates a state in which the sample placing surface of the sample stage 2 and the ion source 1 face each other, and here, the ion beam measuring member 7 and the drive unit 8 are installed immediately before the sample placing surface of the sample stage 2 when viewed from the ion source. The ion beam measuring member 7 and the drive unit 8 may be arranged between the ion source 1 and the sample stage 2, and it is desirable that the ion beam measuring member 7 and the drive unit 8 are placed to the sample 4 as close as possible in order to more accurately estimate a state of the ion beam acting on the sample 4.

The ion beam measuring member 7 which will be described in detail later is a conductive member, leads an ion beam current flowing therethrough by irradiating the ion beam measuring member 7 with the ion beam from the ion source 1 to a control unit outside the sample chamber 6 by an ion beam current detecting wiring 37, and detects an ion distribution emitted from the ion source 1 as a current amount.

In the drawing, the respective drive unit 8 and sample protecting shutter 9 are shown as separate mechanisms from the sample stage 2, and both or either one of the drive unit 8 and the sample protecting shutter 9 can be mounted thereon as a mechanism of the sample stage 2.

Figure 2:
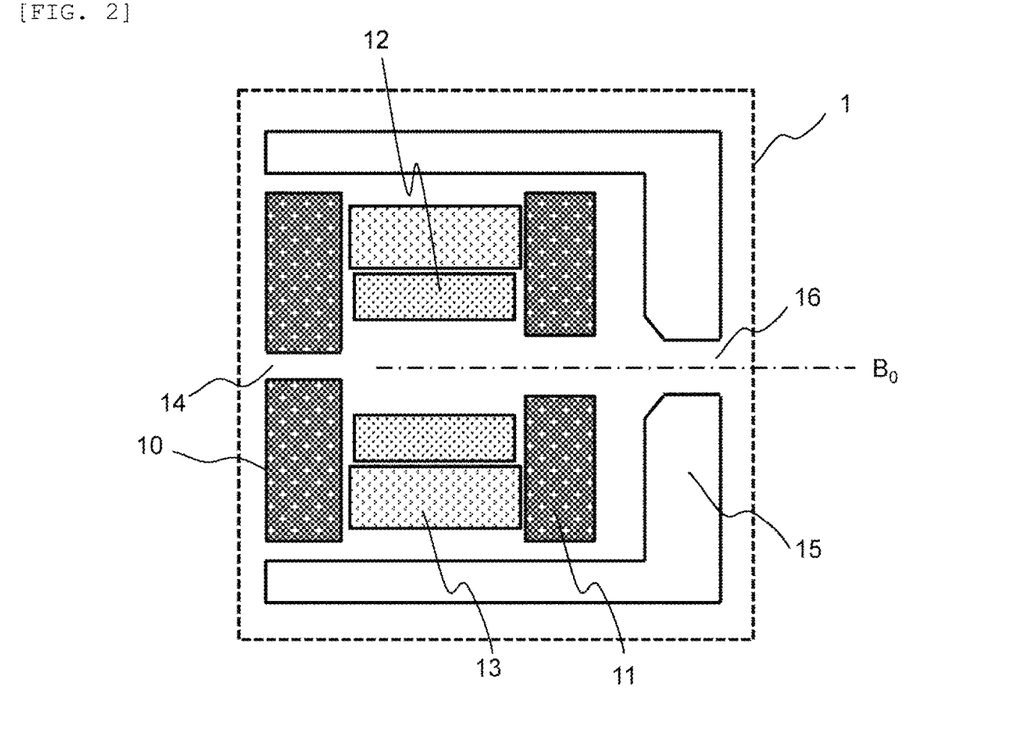
FIG. 2 is a diagram illustrating a configuration of a penning type ion source.

FIG. 2 illustrates a configuration example of the ion source 1 used in the ion milling device. Here, a penning type ion source is used as the ion source 1. The penning type ion source includes: an anode 12 which is arranged in the ion source and to which a discharge voltage is applied; and a first cathode 10 and a second cathode 11 that generate a potential difference with the anode 12, in which an electron is generated by the potential difference between the anode and the cathode. The generated electron floats and stays inside the ion source 1 under the action of a magnetic field generated by a permanent magnet 13. On the other hand, the ion source 1 includes a gas introduction hole 14 for introducing an inert gas from the outside, and for example, argon gas is introduced as the inert gas. When the argon gas is introduced into the ion source in which the electron is generated, an argon ion is generated by collision between an argon atom and the electron. The argon ion is attracted to an acceleration electrode 15 to which an acceleration voltage is applied, passes through anion emission port 16 from the inside of the ion source, and is emitted toward a target to be processed.

When the sample is processed with the penning type ion source, a component inside the ion source is worn and a fine particle scattered from the sample adheres to the ion emission port 16, thereby changing the ion distribution emitted from the ion source. Although it is possible to eliminate the wear and dirt of the component inside the ion source by regularly replacing and cleaning the component, the ion distribution of the ion beam emitted from the ion source is not guaranteed to be in the same state as that before maintenance. When high-precision reproducibility is required for a processed shape of the sample by the ion milling device, with respect to the ion distribution of the ion beam after the replacement work of the component and the cleaning work thereof, it is necessary to confirm whether the desired ion distribution is reproduced, and to adjust an emission condition of the ion source 1 based upon a confirmation result.

Therefore, in the ion milling device of the embodiment, the ion beam measuring member 7 is installed in the sample stage 2 or in the vicinity of the sample stage 2, and the ion beam current is measured while the ion beam measuring member 7 is driven in the X direction by the drive unit 8, thereby estimating the ion distribution of an unfocused ion beam to be emitted from the ion source 1 toward the sample.

Figure 3:
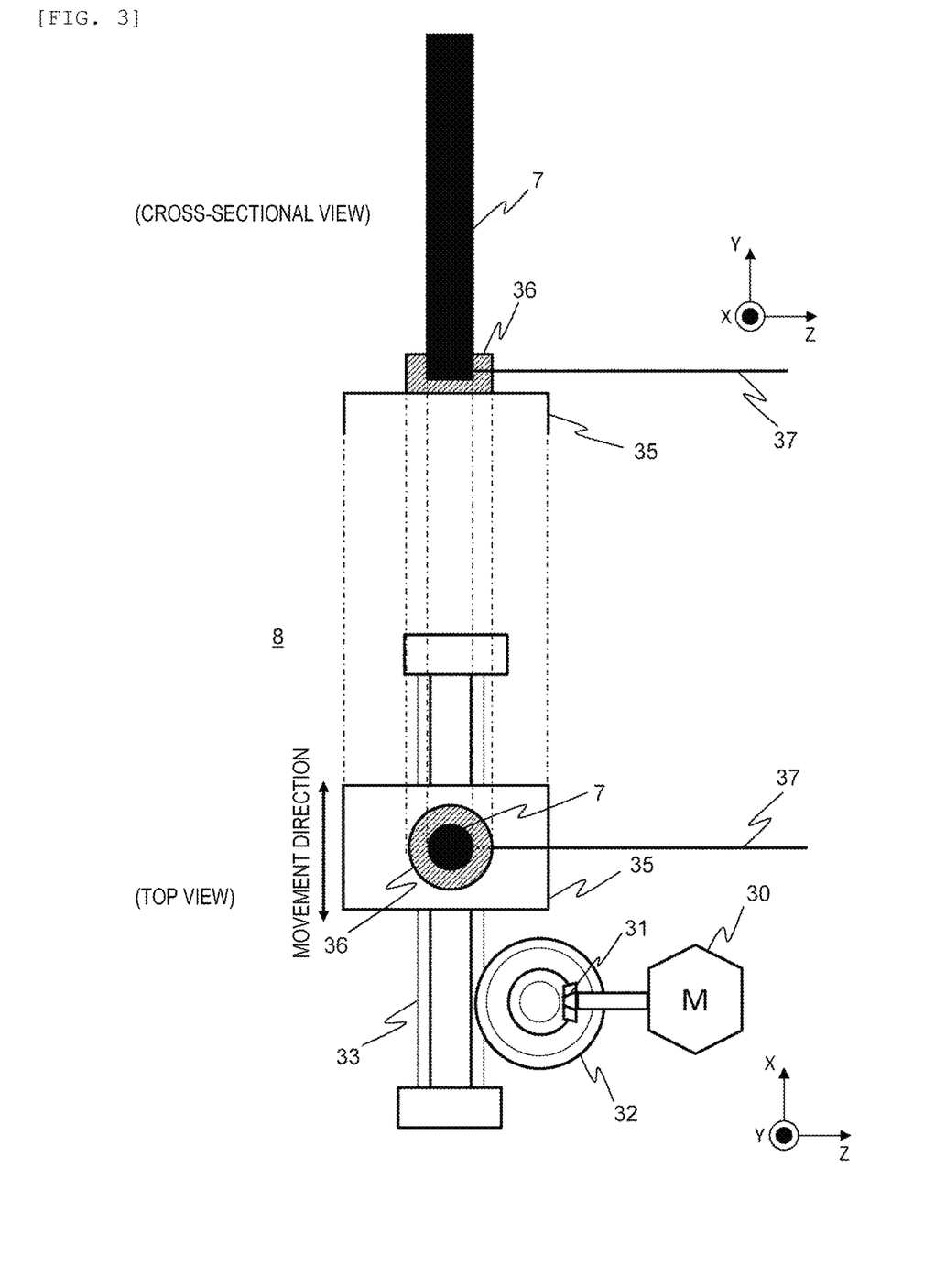
FIG. 3 is a configuration example of a drive unit.

FIG. 3 illustrates a configuration example of the drive unit 8 that drives the ion beam measuring member 7. The drawing shows a top view of the drive unit 8 and a cross-sectional view in a state where the ion beam measuring member 7 is fixed to a base 35 of the drive unit 8. The ion beam measuring member 7 is fixed to the drive unit 8 by a fixing member 36 of the base 35. The fixing member 36 is an insulator, and the ion beam measuring member 7 and the ion beam current detecting wiring 37 are insulated from other components by the fixing member 36. The base 35 can be reciprocated in the X direction by a drive mechanism. The drive mechanism of the embodiment includes a motor 30, a bevel gear 31, a gear 32, and a rail member 33. The base 35 can be reciprocated in the X direction by transmitting the drive to the rail member 33 provided along a movement direction (X direction) of the base 35 by the bevel gear 31 and the gear 32 provided on a drive shaft of the motor 30. The motor 30 is not required to be provided exclusively for the drive unit 8, and can also be used as the sample stage rotation drive source 3 for rotating the sample stage 2.

The ion beam measuring member 7 is in a processed state by being irradiated with the ion beam from the ion source 1 during the measurement of the ion beam current. Since the ion beam measuring member 7 is worn out every time the measurement is performed, it is desirable to use a member having a low sputtering yield, which is difficult to be processed by the ion. A linear member is used as the ion beam measuring member 7, and the ion beam measuring member 7 moves in an unfocused ion beam emission range, thereby grasping the ion distribution. Therefore, a diameter of the ion beam measuring member 7 determines a spatial resolution of the measurable ion distribution. Therefore, it is desirable that the diameter of the ion beam measuring member 7 is smaller than a half value width of the ion beam during the processing. For example, a linear material of graphite carbon having a diameter of 0.2 mm or more and 0.5 mm or less can be used. It is desirable that a cross-sectional shape of the ion beam measuring member 7 is a circular shape in order to prevent an irregular behavior of the ion caused by the collision of the ion with the ion beam measuring member 7. In addition to the linear material of graphite carbon, a linear material of tungsten can also be used. The ion beam measuring member 7 is detachable from the drive unit 8, and when the ion beam measuring member 7 is worn out by the ion beam, the consumed ion beam measuring member 7 is replaced with a new ion beam measuring member.

Figure 4:
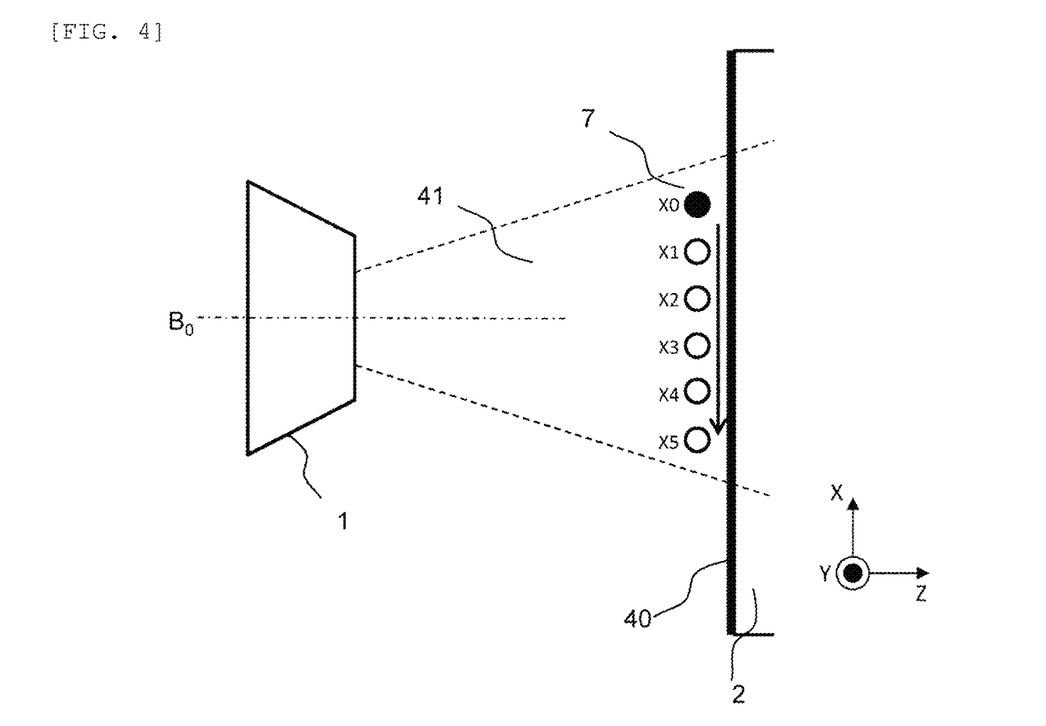
FIG. 4 is a schematic diagram (top view) illustrating a state of ion beam current measurement.

FIG. 4 is a schematic diagram (top view) illustrating a state of ion beam current measurement in the ion milling device of the embodiment. The ion source 1, and the sample stage 2 and the ion beam measuring member 7 that face the ion source 1 are illustrated. Since the ion beam to be emitted from the ion source 1 is unfocused, the unfocused ion beam advances while spreading radially in an area 41 indicated by a broken line. The ion beam measuring member 7 moves along the sample placing surface 40 of the sample stage 2 over the whole ion beam emission range in the X direction, for example, from a coordinate X0 to a coordinate X5, while measuring the ion beam current. The embodiment illustrates an example in which the ion beam measuring member 7 moves in the X direction, and since the ion beam emitted from the ion source 1 spreads in the X direction and the Y direction around the ion beam center B$_0$, a longitudinal direction of the ion beam measuring member 7 is defined as the X direction and the drive unit is configured so that the ion beam measuring member 7 moves along the sample placing surface 40 of the sample stage 2 over the whole ion beam emission range in the Y direction while measuring the ion beam current, such that it is also possible to measure the ion beam current.

Figure 5A:
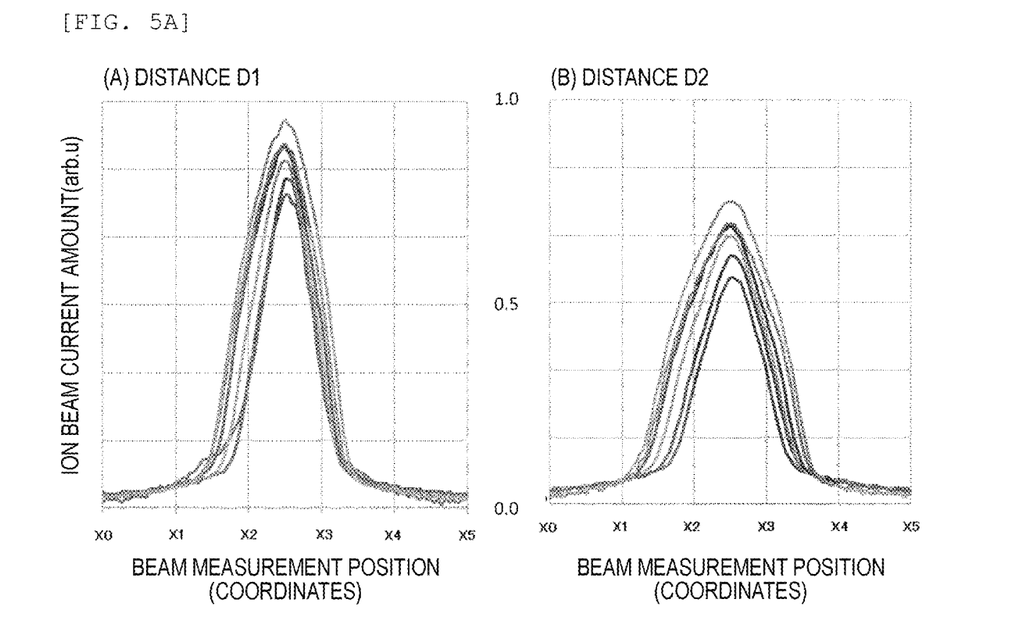
FIG. 5A is a result of measuring an ion beam current by using an ion beam measuring member.

FIG. 5A illustrates a result of measuring the ion beam current by using the ion beam measuring member 7 from the coordinates X0 to X5 (refer to FIG. 4) in the ion milling device of the embodiment. A relationship between a beam measurement position and an ion beam current amount (here, referred to as an "ion beam current profile") illustrated in the drawing can be regarded as the ion distribution emitted from the ion source 1 to the sample 4. (A) is a measurement result of the ion beam current amount at a distance D1 between the ion source and the sample, and (B) is a measurement result of the ion beam current amount at a distance D2 (D2>D1) between the ion source and the sample. A plurality of ion beam current profiles in (A) and (B) are measurement results measured by changing a discharge voltage of the ion source 1 (the discharge voltage is changed in the same manner for both (A) and (B) to perform the measurement). A vertical axis represents the ion beam current amount, and both (A) and (B) are shown as values normalized by a common reference.

As such, the ion distribution changes by changing the distance from the ion source 1 to the sample. Even though the distance from the ion source 1 to the sample is the same, the ion distribution changes by changing the discharge voltage.

Figure 5B:
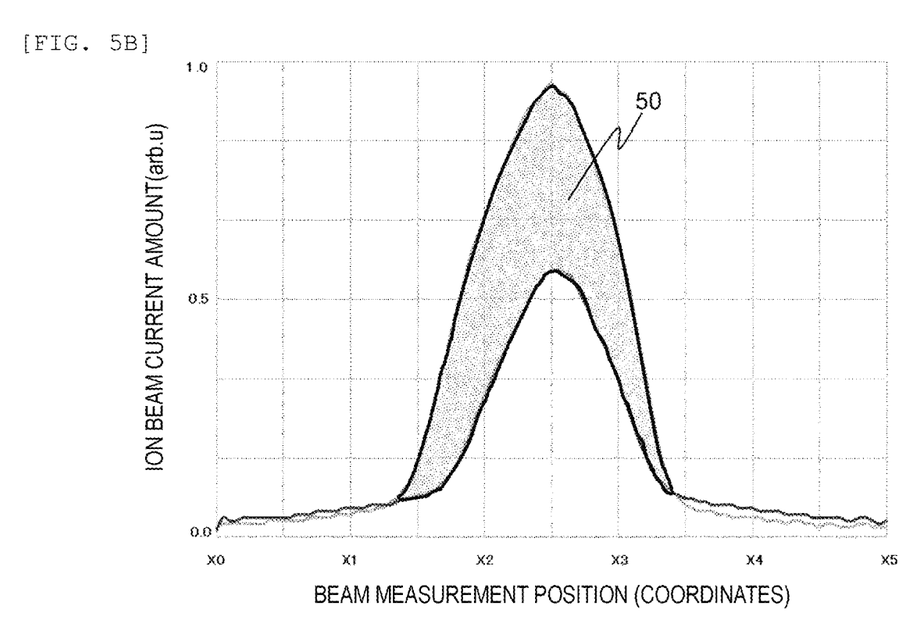
FIG. 5B is a diagram illustrating an ion beam adjustable area.

A graph illustrated in FIG. 5B is a graph in which the two graphs illustrated as FIG. 5A are superimposed and displayed, and an area 50 is an area sandwiched between a maximum value and a minimum value of all the profiles included in the two graphs. That is, it can be said that the area 50 is an area where the ion distribution can be adjusted by adjusting two parameters such as the distance D between the ion source and the sample and the discharge voltage. In the embodiment, the ion distribution emitted from the ion source 1 to the sample 4 is grasped by the ion beam current profile measured by using the ion beam measuring member 7, and the emission condition of the ion source 1 is adjusted so that a shape of the ion beam current profile approaches a desired state, thereby improving the reproducibility of the processed shape of the sample by the ion milling device. Specifically, among the emission conditions of the ion source 1, the distance from the ion source to the sample, the discharge voltage, and a gas flow rate are adjusted.

Figure 6:
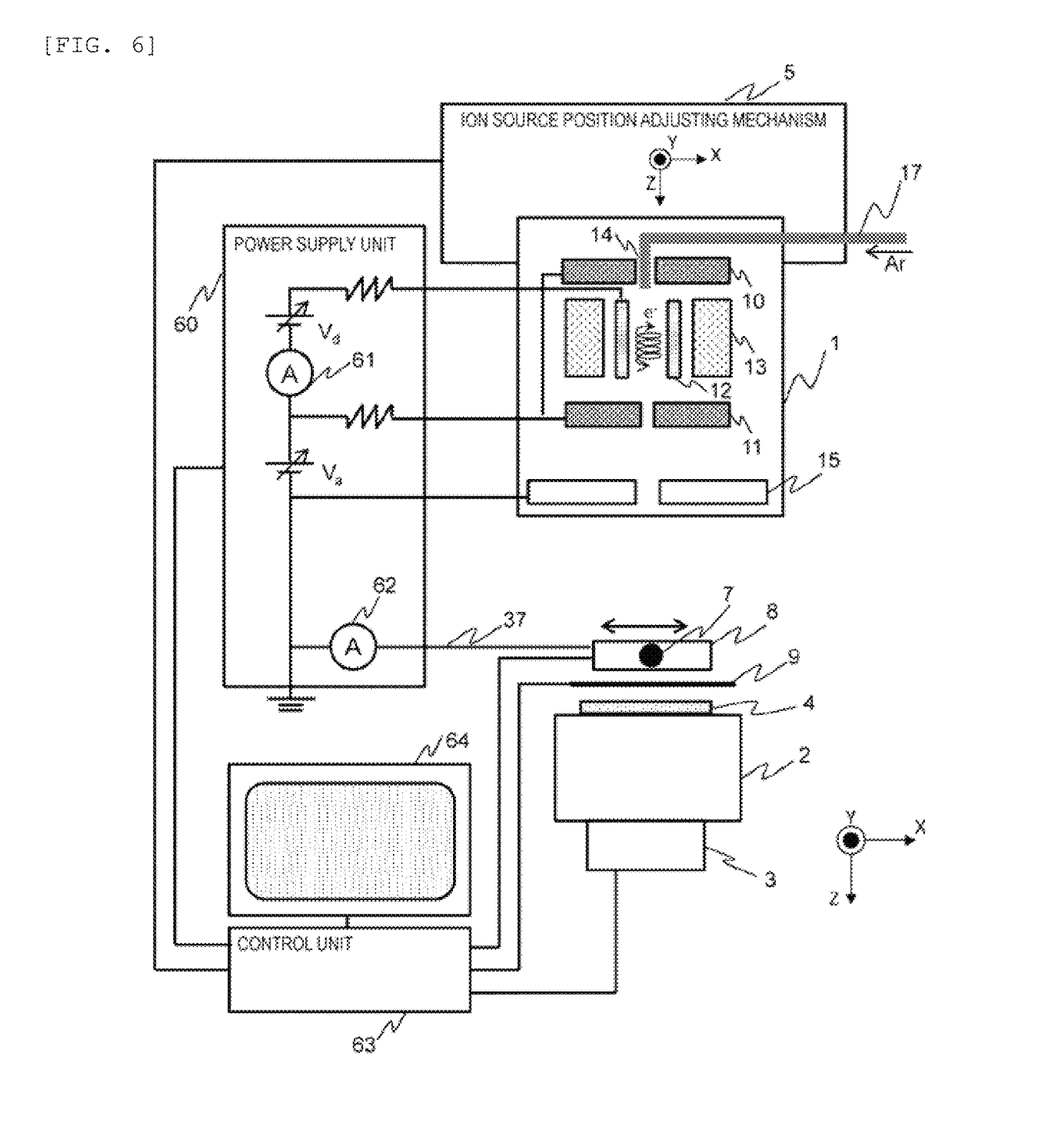
FIG. 6 is a block diagram related to ion distribution adjustment of an ion beam.

FIG. 6 illustrates a block diagram related to ion distribution adjustment of an ion beam. As the ion source 1, the penning type ion source illustrated in FIG. 2 is used. Argon gas is introduced into the ion source 1 via a pipe 17, and an argon ion is generated for performing processing.

A discharge voltage $V_d$ and an acceleration voltage $V_a$ applied to the ion source 1 are generated by a power supply unit 60. The power supply unit 60 includes ammeters, in which an ammeter 61 measures a discharge current, and an ammeter 62 measures an ion beam current flowing by collision of the ion from the ion source 1 with the ion beam measuring member 7. Values of the discharge voltage $V_d$ and the acceleration voltage $V_a$ are set by a control unit 63.

The ion source 1 is fixed to the ion source position adjusting mechanism 5, and the position of the ion source 1 can move independently in the X direction, the Y direction, and the Z direction.

The sample protecting shutter 9 is arranged between the drive unit 8 and the sample 4, and is configured to be movable vertically in the Y direction by the control of the control unit 63. As a drive source for the sample protecting shutter 9, a motor and a solenoid can be used, and in order to perform movement control, it is desirable to include a sensor that detects a vertical movement position of the shutter. The sample protecting shutter 9 is provided to not irradiate the sample 4 with an unnecessary ion beam when the acquisition of the ion beam current profile is performed in a state where the sample 4 is placed on the sample stage 2.

The power supply unit 60, the ion source position adjusting mechanism 5, the drive unit 8, the sample protecting shutter 9, the sample stage 2, and the sample stage rotation drive source 3 are connected to the control unit 63, and the control unit 63 acquires the ion beam current profile, adjusts the ion beam emission condition, and processes the sample. The control unit 63 is connected to a display unit 64, and the display unit 64 functions as a user interface from an operator with respect to the control unit 63, and displays sensing data indicating an operating state of the ion milling device collected by the control unit 63. For example, the sensing data displayed on the display unit 64 includes the discharge voltage value $V_d$, the discharge current value, the acceleration voltage value $V_a$, and the ion beam current value from the power supply unit 60.

A method for acquiring the ion beam current profile and adjusting the ion beam emission condition performed by the control unit 63 in the ion milling device illustrated in FIG. 6 will be described with reference to FIG. 7.

Step S701: The control unit 63 controls the drive unit 8 and moves the ion beam measuring member 7 to an origin position in the X direction. Here, for the simplicity of description, the origin position in the X direction is determined to coincide with an outermost position of the ion beam emission range. A method for taking the origin position is not limited thereto.

Step S702: The control unit 63 controls the movement of the sample protecting shutter 9, and moves the sample protecting shutter 9 to a beam shielding position.

Step S703: The control unit 63 controls the power supply unit 60, and outputs an ion beam from the ion source 1 according to an ion beam emission condition stored as a current setting. The current setting refers to the ion beam emission condition determined as a processing condition of the sample 4. Generally, an acceleration voltage, a discharge voltage, and a gas flow rate of the ion source 1 when processing the sample 4 are determined.

Step S704: After starting the output of the ion beam therefrom, the control unit 63 controls the drive unit 8 to start the movement of the ion beam measuring member 7 in the X direction. As described with reference to FIG. 4, a movement direction is a direction from the outermost position of the ion beam emission range (origin position in the X direction) toward an end portion of the other ion beam emission range. The control unit 63 manages a current position of the moving ion beam measuring member 7 in the X direction.

Step S705: When the ion beam measuring member 7 is irradiated with the ion beam from the ion source 1, the ammeter 62 starts to measure an ion beam current flowing through the ion beam measuring member 7 and the ion beam current detecting wiring 37. The control unit 63 acquires and stores an ion beam current detection value digitized by the ammeter 62.

Step S706: The control unit 63 displays the acquired ion beam current value on the display unit 64 as a current detection result. A display format is desirably the beam measurement position-ion beam current amount graph (ion beam current profile) illustrated in FIG. 5A. The current detection result may be displayed on a host PC connected to the ion milling device via LAN or a serial circuit which is not illustrated.

Step S707: The control unit 63 confirms the current position in the X direction of the ion beam measuring member 7 moved by the drive unit 8, and when the movement of the ion beam measuring member 7 is not completed, the control unit 63 repeatedly executes steps S704 to S706 until the ion beam measuring member 7 completes the movement over the whole ion beam emission range.

Step S708: When confirming that the ion beam measuring member 7 completes the movement over the whole ion beam emission range in step S707, the control unit 63 ends the movement of the ion beam measuring member 7.

Step S709: The control unit 63 calculates an adjustment amount from an ion beam current measurement result. As a comparison target of the adjustment amount, the ion beam current measurement result stored in the control unit 63 by performing the same measurement when determining a processing condition applied to the processing of the sample 4 is used, or the previously measured ion beam current measurement result is used. An operator can set in advance which comparison target is to be used. When a reference ion beam current profile (reference ion distribution) which becomes the comparison target and an ion beam current profile (ion distribution) obtained as an ion beam current measurement result measured this time are ideally equal to each other, or when the ion beam emission condition can be adjusted so that the reference ion beam current profile and the ion beam current profile are similar to each other, it is possible to improve the reproducibility of the processed shape of the sample by the ion milling device. A degree of approximation may be determined depending on a degree of the reproducibility of a processed shape of a required sample.

However, in the embodiment, since the ion distribution is observed only by the ion beam current, the acceleration voltage $V_a$ among the adjustable parameters of the ion source 1 is not changed. The reason is that when the acceleration voltage $V_a$ is changed, a processing speed (milling rate) of the sample significantly changes even though the ion beam current is the same. That is, in the adjustment of the embodiment, it is assumed that processing time of the sample is not an adjustment target.

Figure 8:
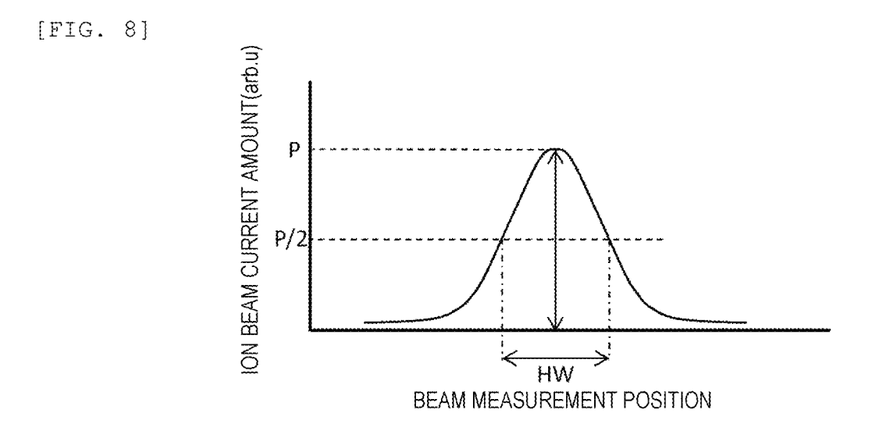
FIG. 8 is a schematic diagram of the ion beam current profile.

FIG. 8 illustrates a schematic diagram of the ion beam current profile. As a simple method for matching the shapes of the ion beam current profiles, a method for adjusting a peak value P of a representative value of the shape of the ion beam current profile and a half value width HW thereof (spread of the ion beam current profile in which the ion beam current amount becomes half of the peak value P) to be equal to each other will be described. The reason is that when the two values match, the shapes of the ion beam current profiles can be evaluated as approximately equal to each other. The parameters of the ion beam emission condition to be adjusted are the discharge voltage of the ion source 1, the gas flow rate thereof, and the distance D between the ion source 1 and the sample 4 (or the sample placing surface of the sample stage 2, using the sample 4 as a representative).

The distance between the ion source 1 and the sample 4 is changed, thereby making it possible to mainly adjust the value of the peak value P as illustrated in FIG. 5A. The discharge voltage $V_d$ increases, thereby making it possible to prevent the spread of the argon ion generated inside the ion source 1, and as a result, a size of the half value width HW can be adjusted. In the same manner, when the gas flow rate increases, the spread of the argon ion generated inside the ion source 1 can be prevented, and as a result, the size of the half value width HW can be adjusted. As such, the distance between the ion source 1 and the sample 4 and the value of at least one of the discharge voltage $V_d$ and the gas flow rate are adjusted, thereby making it possible to allow the ion beam current profile to be closer to a desired shape. As illustrated in FIG. 5B, it can be seen that a wide adjustment area can be obtained only by adjusting the distance between the ion source 1 and the sample 4 and the discharge voltage $V_d$.

Here, an example of obtaining the adjustment amount by using the peak value P of the ion beam current profile and the half value width HW thereof will be described, and feature amounts of a large number of profile shapes may be extracted and adjusted. For example, a feature amount related to symmetry of the profile shape may be extracted and adjusted.

Step S710: The emission condition of the ion beam is adjusted based upon the adjustment amount calculated in step S709. Specifically, the control unit 63 executes one or a plurality of controls among the adjustment of the distance between the ion source 1 and the sample 4 by the control of the ion source position adjusting mechanism 5, the control of the discharge voltage $V_d$ of the ion source 1 by the control of the power supply unit 60, and the control of the gas flow rate supplied to the ion source 1 by the control of a gas supply mechanism (not illustrated), based upon the calculation result in step S709.

Step S711: After the adjustment according to step S710 is performed, when the ion beam current profile is remeasured, the processing is executed again from step S701, and when the ion beam current profile is not remeasured, the adjustment is completed.

Step S712: The control unit 63 moves the sample protecting shutter 9 to a beam non-shielding position, and ends the adjustment.

Figure 7:
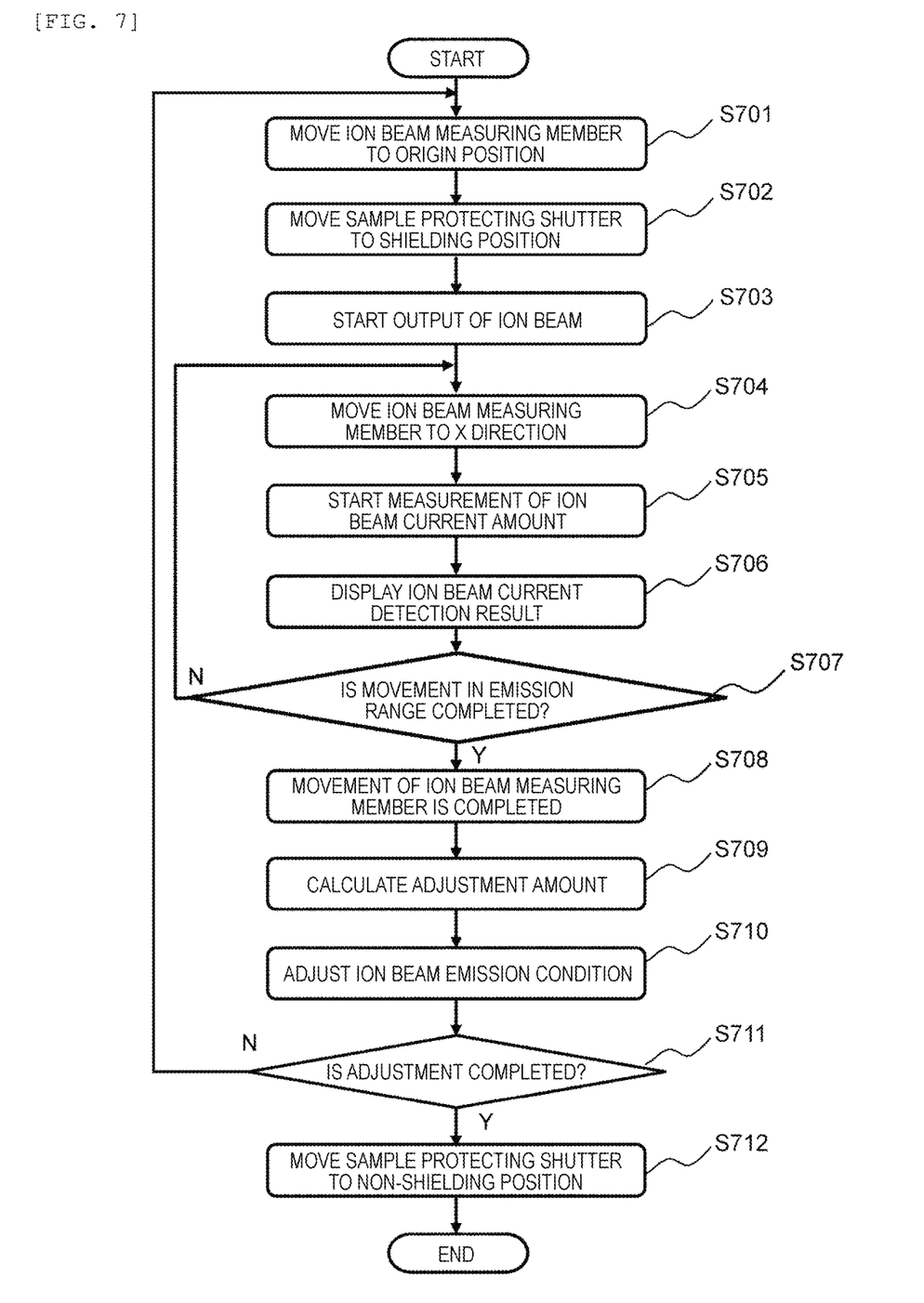
FIG. 7 is a flowchart of acquisition of an ion beam current profile and adjustment of an ion beam emission condition.

The flowchart of FIG. 7 is an example, and various modifications can be performed. For example, in step S706, the ion beam current measurement result and the reference ion beam current profile which becomes the comparison target of the adjustment amount may be superimposed and displayed. When the operator determines that the adjustment is unnecessary by the superimposed display, a step of stopping the adjustment of the ion beam may be added. In step S710, the control unit 63 controls the distance between the ion source 1 and the sample 4, and for example, the distance therebetween may be adjusted in a manner that a control amount is displayed on the display unit 64, and the operator manually moves the position of the ion source 1 by the ion source position adjusting mechanism 5.

While the invention made by the present inventor has been specifically described above based upon the embodiments, the present invention is not limited to the described embodiments, and various modifications can be made without departing from the gist thereof. For example, the configuration of FIG. 1 is provided with the sample protecting shutter for preventing the sample from being irradiated with the ion beam when the ion beam current profile is acquired, and when irradiation of the sample with the ion beam can be ignored during the period of acquiring the ion beam current profile, the sample protecting shutter 9 may not be provided. The embodiment describes the ion milling device for performing plane milling processing as an example, and the present invention is also applicable to an ion milling device for performing cross-section milling processing. In the case of the cross-section milling processing, there is a difference that a rotation axis (swing axis) of the sample stage 2 is arranged to extend in the Y direction, and the emission condition of the ion beam can be adjusted by the same structure.

REFERENCE SIGNS LIST

1: ion source
2: sample stage
3: sample stage rotation drive source
4: sample
5: ion source position adjusting mechanism
6: sample chamber
7: ion beam measuring member
8: drive unit
9: sample protecting shutter
10, 11: cathode
12: anode
13: permanent magnet
14: gas introduction hole
15: acceleration electrode
16: ion emission port
17: pipe
30: motor
31: bevel gear
32: gear
33: rail member
35: base
36: fixing member
37: ion beam current detecting wiring
40: sample placing surface
60: power supply unit
61, 62: ammeter
63: control unit
64: display unit

The invention claimed is:

1. An ion milling device, comprising:
an ion source;
a sample stage on which a sample to be processed by being irradiated with an unfocused ion beam from the ion source is placed;
a drive unit configured to be arranged between the ion source and the sample stage, and to move a linear ion beam measuring member extending in a first direction to a second direction orthogonal to the first direction; and
a control unit, wherein
the control unit moves the ion beam measuring member within an emission range of the ion beam by the drive unit in a state where the ion beam is outputted from the ion source under a first emission condition, measures an ion beam current flowing through the ion beam measuring member by irradiating the ion beam measuring member with the ion beam, and stores an ion beam current profile indicating a relationship between the ion beam current and a position of the ion beam measuring member when the ion beam current is measured,
the control unit obtains an adjustment value of the first emission condition based upon the ion beam current profile,
the control unit compares the ion beam current profile with a preset reference ion beam current profile, thereby obtaining the adjustment value of the first emission condition, and
the control unit obtains the adjustment value of the first emission condition so that a peak value and a half value width of the ion beam current profile are equal to or approximate to a peak value and a half value width of the reference ion beam current profile.

2. The ion milling device according to claim 1, further comprising:
a sample chamber; and
an ion source position adjusting mechanism installed in the sample chamber, wherein
the ion source is attached to the sample chamber via the ion source position adjusting mechanism,
the ion source is a penning type ion source, and
the control unit includes at least one of a discharge voltage of the ion source, a gas flow rate of the ion source, and a distance between the ion source and the sample as a parameter for obtaining the adjustment value of the first emission condition.

3. The ion milling device according to claim 1, wherein an ion beam center of the ion beam from the ion source is orthogonal to a plane formed by the first direction and the second direction.

4. The ion milling device according to claim 1, wherein the ion beam measuring member is a linear material of graphite carbon whose cross section is a cylindrical shape and whose diameter is equal to or less than a half value width of the ion beam.

5. The ion milling device according to claim 1, further comprising:
a sample protecting shutter that shields the sample from the ion beam emitted from the ion source between the sample stage and the drive unit.

6. An ion milling device, comprising:
an ion source;
a sample stage on which a sample to be processed by being irradiated with an unfocused ion beam from the ion source is placed;
a drive unit configured to be arranged between the ion source and the sample stage, and to move a linear ion beam measuring member extending in a first direction to a second direction orthogonal to the first direction;
a control unit, wherein
the control unit moves the ion beam measuring member within an emission range of the ion beam by the drive unit in a state where the ion beam is outputted from the ion source under a first emission condition, measures an ion beam current flowing through the ion beam measuring member by irradiating the ion beam measuring member with the ion beam, and stores an ion beam current profile indicating a relationship between the ion beam current and a position of the ion beam measuring member when the ion beam current is measured,
the control unit obtains an adjustment value of the first emission condition based upon the ion beam current profile, and
the control unit compares the ion beam current profile with a preset reference ion beam current profile, thereby obtaining the adjustment value of the first emission condition; and
a display unit configured to superimpose and display the ion beam current profile and the reference ion beam current profile.

7. An ion milling device, comprising:
a sample chamber;
an ion source position adjusting mechanism installed in the sample chamber;
an ion source attached to the sample chamber via the ion source position adjusting mechanism;
a sample stage on which a sample to be processed by being irradiated with an ion beam that is unfocused from the ion source and has an ion distribution in which ion density is the highest at a center portion and the ion density becomes lower toward the outside is placed; and
a control unit, wherein
the control unit obtains an adjustment value of a first emission condition so that the ion distribution when the sample is irradiated with the ion beam from the ion source under the first emission condition becomes equal to or approximate to a preset reference ion distribution,
the ion source is a penning type ion source, and
the control unit includes at least one of a discharge voltage of the ion source, a gas flow rate of the ion source, and a distance between the ion source and the sample as a parameter for obtaining the adjustment value of the first emission condition.

8. The ion milling device according to claim 7, wherein the control unit obtains the adjustment value of the first emission condition by comparing the ion distribution when the sample is irradiated with the ion beam from the ion source under the first emission condition with the reference ion distribution.

9. The ion milling device according to claim 8, wherein the control unit obtains the adjustment value of the first emission condition so that a peak value and a half value width of the ion distribution when the sample is irradiated with the ion beam from the ion source under the first emission condition are equal to or approximate to a peak value and a half value width of the reference ion distribution.

10. The ion milling device according to claim 7, further comprising:
a drive unit configured to be arranged between the ion source and the sample stage, and to move a linear ion beam measuring member extending in a first direction to a second direction orthogonal to the first direction, wherein
the control unit moves the ion beam measuring member within an emission range of the ion beam by the drive unit in a state where the ion beam is outputted from the ion source under the first emission condition, and measures an ion beam current flowing through the ion beam measuring member by irradiating the ion beam measuring member with the ion beam, and
the ion beam current is regarded as the ion distribution at a position of the ion beam measuring member when the ion beam current is measured.

11. The ion milling device according to claim 10, wherein an ion beam center of the ion beam from the ion source is orthogonal to a plane formed by the first direction and the second direction.

* * * * *